United States Patent [19]

Satoh

[11] 4,104,733
[45] Aug. 1, 1978

[54] ADDRESS SELECTING CIRCUITRY FOR SEMICONDUCTOR MEMORY DEVICE

[75] Inventor: Takashi Satoh, Kodaira, Japan

[73] Assignee: Hitachi, Ltd., Japan

[21] Appl. No.: 824,740

[22] Filed: Aug. 15, 1977

[30] Foreign Application Priority Data

Aug. 23, 1976 [JP] Japan .................................. 51-99685

[51] Int. Cl.² ............................................ G11C 11/40
[52] U.S. Cl. .................................... 365/189; 365/182; 307/238
[58] Field of Search ....................... 365/174, 182, 189; 307/238, 279

[56] References Cited

U.S. PATENT DOCUMENTS 3,969,706 7/1976 Proebsting ...................... 340/173 X Primary Examiner—Terrell W. Fears
Attorney, Agent, or Firm—Craig & Antonelli

[57] ABSTRACT

In an address selecting circuitry for a semiconductor memory device including a matrix of memory cells arrayed in rows and columns, an address input signal $A_i$ for any given bit of address data is applied to a single address signal setting circuit to produce a set of two different logic signals $\bar{a}_i$ and $\bar{a}_i$ in accordance with the state of the address input signal, and the set of logic signals $a_i$ and $a_i$ are supplied to a row decoder driving circuit as well as a column decoder driving circuit which are connected to row and column decoder circuits respectively. The row and column decoder driving circuits are driven by row and column decoder drive timing signals respectively to drive selected row and column decoders so that predetermined row and column lines are selected.

9 Claims, 4 Drawing Figures

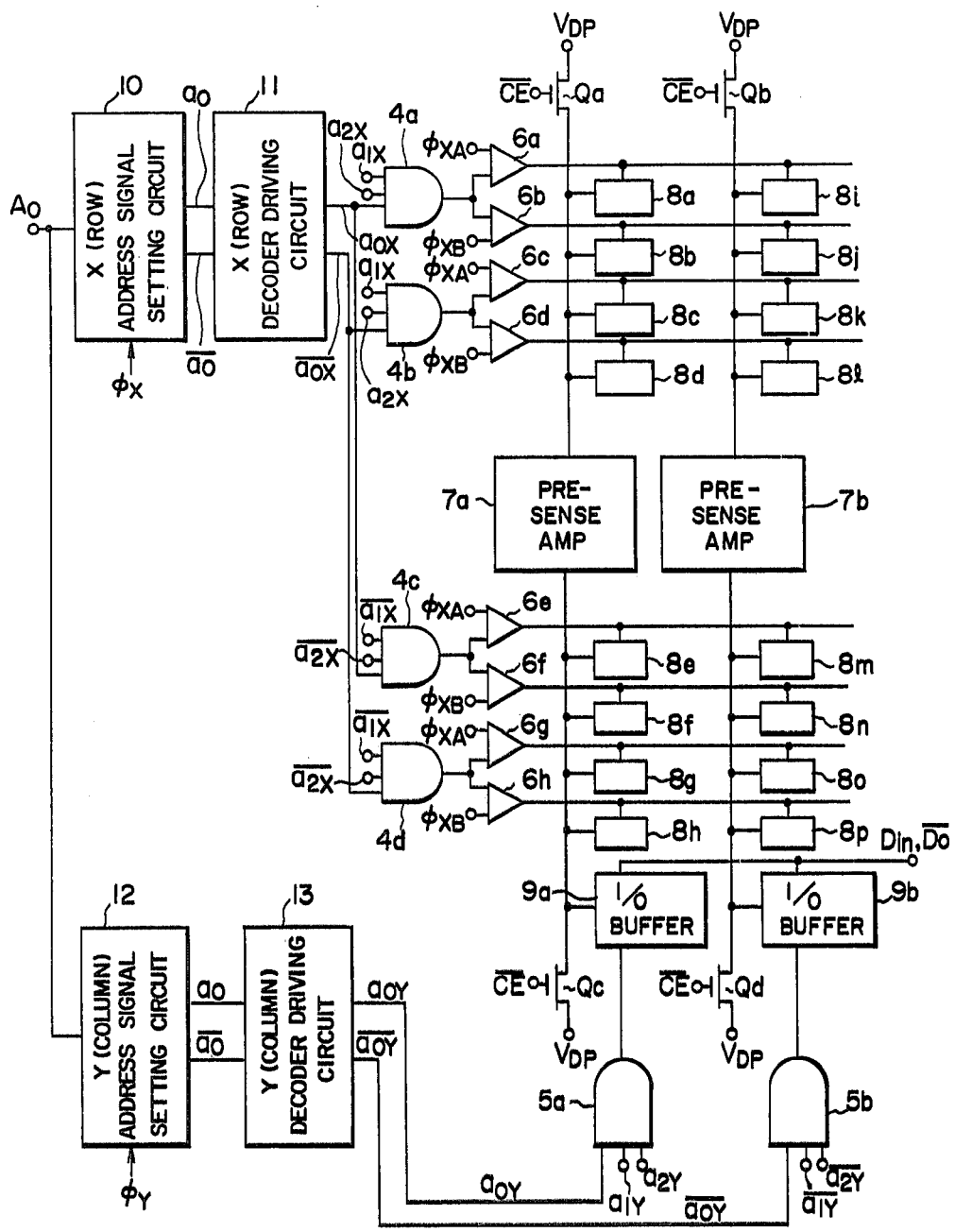

ADDRESS SELECTING CIRCUITRY FOR SEMICONDUCTOR MEMORY DEVICE

LIST OF PRIOR ART REFERENCES (37 CFR 1.56 (a))

The following references are cited to show the state of the art: U.S. Pat. No. 3,969,706, Proebsting et al., Jul. 13, 1976, 340/173R.

BACKGROUND OF THE INVENTION

This invention relates to an address selecting circuitry and more particularly to the address selection for a semiconductor memory device using insulated-gate field effect transistors (hereafter referred to simply as FETs).

In a conventional semiconductor memory device, e.g. a random-access memory having 4096 memory cells (hereafter referred to simply as 4KRAM), disclosed in, for example, FIGS. 1, 3 and 5 of U.S. Pat. No. 3,969,706 specification, 6-bit row address and 6-bit column address data is supplied to six address input pins, each address input pin is connected with row and column address buffer circuits each of which receives an address input signal $A_i$ of TTL (Transistor-Transistor Logic) level to produce true and complement signals $a_i$ and $\bar{a}_i$ of MIS or MOS level, and these signals $a_i$ and $\bar{a}_i$ are used to drive row and column decoders for the selection of a particular memory cell. In such a 4KRAM, there must be provided two address buffer circuits (for row address selection and column address selection) for every address input pin so that the address buffer circuits to be used totals 12 ($6 \times 2 = 12$). The provision of a large number of address buffer circuits would encounter the following problems. Namely, too much power would be consumed in the case where a RAM has a larger capacity. The integration density of circuits cannot be improved. The input capacity at the address input pin becomes large. Erroneous operations such as erroneous address selection are liable to be caused due to the accompanying increase in the number of peripheral circuits so that the reliability is poor.

SUMMARY OF THE INVENTION

An object of this invention is to provide an address selecting circuitry for a semiconductor memory device, in which power consumption is small.

Another object of this invention is to provide an address signal setting circuit (address buffer circuit) which can stably operate with small power consumption.

A further object of this invention is to provide an address selecting circuitry which has a reduced number of address signal setting circuits and therefore can operate with small power consumption.

A still further object of this invention is to provide an address selecting circuitry whose integration density can be improved.

A furthermore object of this invention is to provide an address selecting circuitry which has a smaller input capacity at every address input pin, a high stability and a high reliability.

In an address selecting circuitry for a semiconductor memory device according to this invention, an address input signal $A_i$ for any given bit of address data is applied to a single address signal setting circuit to produce a set of two different logic signals $a_i$ and $\bar{a}_i$ in accordance with the state of the address input signal, the set of logic signals $a_i$ and $\bar{a}_i$ are supplied to a row decoder driving circuit as well as a column decoder driving circuit which are connected to row and column decoder circuits respectively, and the row column decoder driving circuits are driven by row and column decoder drive timing signals respectively to drive selected row and column decoders so that predetermined row and column lines are selected.

BRIEF DESCRIPTION OF THE DRAWINGS

FIG. 4 shows a part of 4KRAM device which has been proposed by the present inventor but does not include the features of this invention.

DESCRIPTION OF THE PREFERRED EMBODIMENTS

Figure 1:
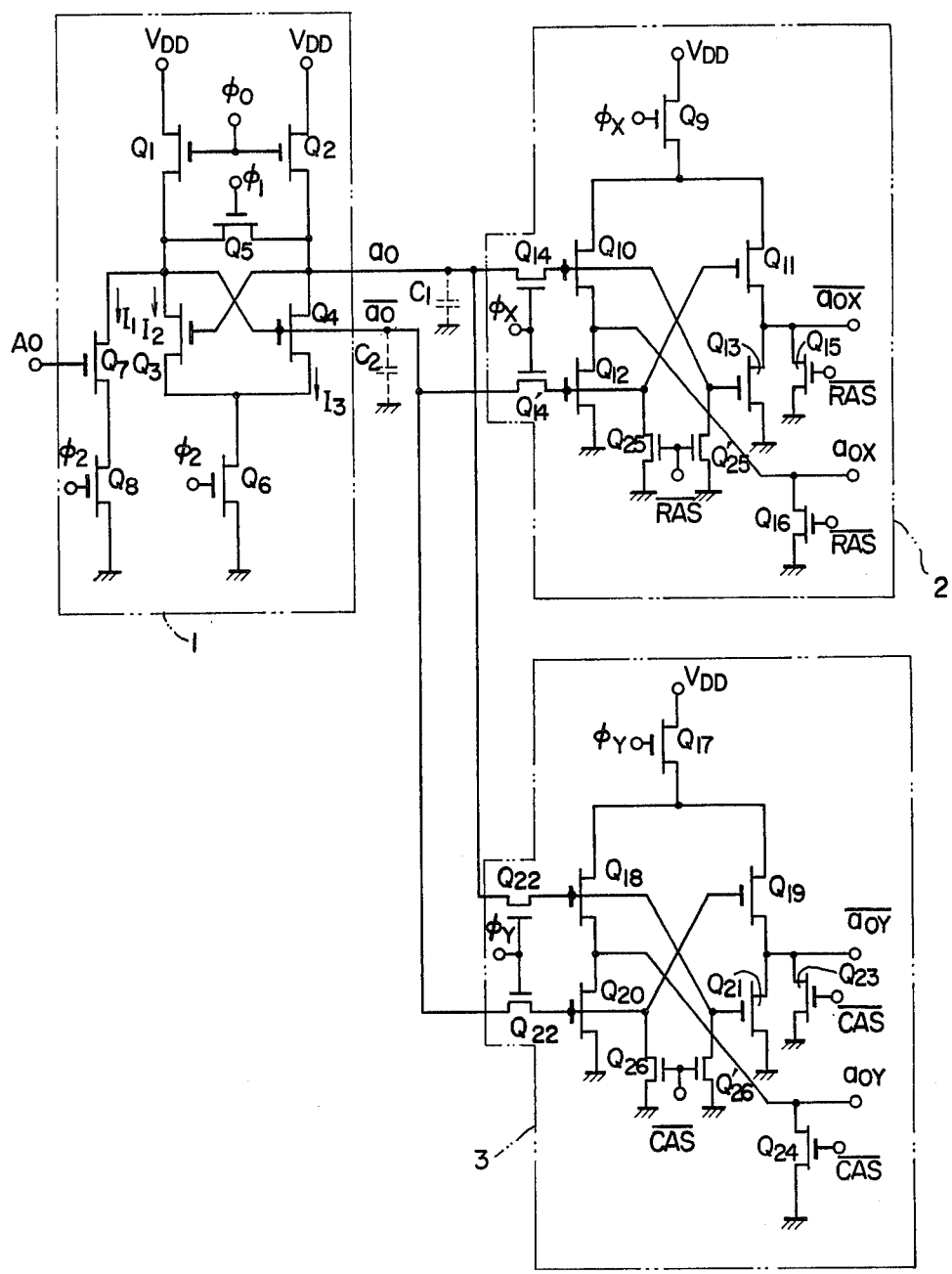
FIG. 1 shows an address selecting circuitry as an embodiment of this invention.

Before describing embodiments of this invention, a 4KRAM device which has been proposed by the present inventor but does not include the feature of this invention will be explained with the aid of FIG. 4.

FIG. 4 shows a part of a 4KRAM device which comprises six equivalent input circuits having six address input pins to which six address input signals $A_0 - A_5$ are applied respectively, only one address input signal $A_0$ being shown as associated with a memory cell section. An X (row) line address signal setting circuit 10 is driven by a driving signal $\phi_X$ so as to convert the address input signal $A_0$ of TTL level to two different signals $a_0$ and $\bar{a}_0$ of MIS or MOS level ($V_{DD}$ level) and an X (rows) line decoder driving circuit 11 delivers X decoder driving signals $a_{0X}$ and $\bar{a}_{0X}$. On the other hand, a Y (column) line address signal setting circuit 12 is driven by a driving signal $\phi_Y$ and converts the address input signal $A_0$ of TTL level to two different signals $a_0$ and $\bar{a}_0$ of MIS level and a Y (column) line decoder driving circuit 13 delivers two Y decoder driving signals $a_{0Y}$ and $\bar{a}_{0Y}$. Thus, the example shown in FIG. 4 is an address selecting circuitry in which one address input signal $A_0$ is applied to X and Y address signal setting circuits to drive X and Y decoders. The address signal setting circuit is also referred to as address buffer or latch circuit.

Now, the connection with the memory cell will be described. In FIG. 4, reference characters $4a - 4d$ indicate X (row) line selecting decoders, $6a' - b$ indicate gate circuits and $7a$ and $7b$ indicate pre-sense amplifiers. Memory cells $8a - 8p$ connected with X and Y lines are divided by the pre-sense amplifiers $7a$ and $7b$ into two groups symmetrically arranged with each other. The effect of such a symmetrical division is to decrease differential noise in the input signal to the pre-sense amplifiers. Further, to decrease the output load capacitance of the address buffer circuit, the X decoders $4a - 4d$ receive not only the outputs $a_{0X}$ and $\bar{a}_{0X}$ of the driving circuit 11 to which the address signal $A_0$ is applied, but also the outputs from the other driving circuits to which the other address signals ($A_1 - A_5$) are applied. Moreover, in FIG. 4, two gate circuits are driven by one decoder (e.g. gate circuits $6a$ and $6b$ for decoder $4a$) so that for convenience in design a single decoder may provide a 2-bit configuration. The pair of the gate circuits receive bit selecting signals $\phi_{XA}$ and $\phi_{XB}$ having different phases and and controlled by the other address signals in order that the gate circuits may not simultaneously deliver outputs "1".

Y (column) line selecting decoders 5a and 5b receive the outputs $a_{0Y}$ and $\bar{a}_{0Y}$ of the Y decoder driving circuit 13 and also the outputs from the other drive circuits to which the other address signals ($A_1 - A_5$) are applied. The outputs of the Y decoders 5a and 5b are applied to I/O (input/output) buffer circuits 9a and 9b. FETs $Q_a$ and $Q_b$ serve to precharge the lines (i.e., digit lines) to the pre-sense amplifiers 7a and 7b at a level of $V_{DP}$ at the time of non-selection of chip ($\overline{CE}$), i.e., when the chip is not selected and FETs $Q_c$ and $Q_d$ serve to precharge the lines (i.e., digit lines) to the pre-sense amplifiers 7a and 7b at the level of $V_{DP}$ at the time of non-selection of chip.

In FIG. 4, it should be noted that each of only four X decoders and only two Y decoders is shown to has only three inputs for convenience of illustration. In fact, X decoder driving circuits associated with the other address input signal $A_1$ to $A_5$ generate their outputs $a_{1X}$, $\bar{a}_{1X}$ to $a_{5X}$, $\bar{a}_{5X}$ respectively, and each X decoder has five inputs to which the output signals $a_{0X}$, $\bar{a}_{1X}$, $a_{2X}$, $a_{3X}$ and $a_{4X}$ are respectively applied with a proper combination of true and complement of their signals. In the entire system, 32 (= 25) X decoders and hence 64 (= 2 × 32) gate circuits are provided. For example, the 1st X decoder receives $a_{0X}$, $a_{1X}$, $a_{2X}$, $a_{3X}$ and $a_{4X}$, the 16th X decoder receives $\bar{a}_{0X}$, $\bar{a}_{1X}$, $\bar{a}_{2X}$, $\bar{a}_{3X}$ and $a_{4X}$, the 17th X decoder receives $a_{0X}$, $a_{1X}$, $a_{2X}$, $a_{3X}$ and $\bar{a}_{4X}$ and the 32nd X decoder receives $\bar{a}_{0X}$, $\bar{a}_{1X}$, $\bar{a}_{2X}$, $\bar{a}_{3X}$ and $\bar{a}_{4X}$. The output $a_{5X}$ and $\bar{a}_{5X}$ of the X decoder driving circuit associated with the address input signal $A_5$ are used for the bit selecting signals $\phi_{XA}$ and $\phi_{XB}$ which are applied to the gate circuits 6a – 6h. On the other hand, it should be noted that each Y decoder has six inputs to which the outputs $a_{0Y}$, $a_{1Y}$, $a_{2Y}$, $a_{3Y}$, $a_{4Y}$ and $a_{5Y}$ from six Y decoder driving circuits associated with the address input signals $A_0 - A_5$ are respectively applied with a proper combination of true and complement of their signals. In the entire system, 64 Y decoders are provided. For example, the 1st Y decoder receives $a_{0Y}$, $a_{1Y}$, $a_{2Y}$, $a_{3Y}$, $a_{4Y}$ and $a_{5Y}$, and the 64th Y decoder receives $\bar{a}_{0Y}$, $\bar{a}_{1Y}$, $\bar{a}_{2Y}$, $\bar{a}_{3Y}$, $\bar{a}_{4Y}$ and $\bar{a}_{5Y}$.

According to the address selecting circuitry having such an arrangement as described above, the X and Y address signal setting circuits corresponding to the selected address are set, the X and Y decoders connected with the X and Y address signal setting circuits are driven, and desired X and Y lines are selected to process information stored in the memory cell.

However, the above-described address selecting circuitry needs two address signal setting circuits (for X address selection and Y address selection) for every address input signal. Namely, there are needed twelve address signal setting circuits for a completed 4KRAM and therefore the following problems are encountered. The twelve address signal setting circuits (address buffer circuits) used in a 4KRAM consume rather a large power, which unfavorable especially for a RAM having a larger capacity. Also, the fact that there are used a large number of address buffer circuits adversely affects the improvement in integration density and also increases the input capacity at every address input pin. Further, the resultant increase in the number of peripheral circuits leads to the increase in liability to erroneous operations such as erroneous address selection etc. so that the reliability becomes poor.

This invention has been made to eliminate these problems.

FIG. 1 shows an address selecting circuitry as an embodiment of this invention. As shown in the figure, an address input signal $A_0$ is applied to an address signal setting circuit (address buffer circuit) 1 whose outputs $a_0$ and $\bar{a}_0$ are supplied to an X (row) line selecting decoder driving circuit 2 and a Y (column) line selecting decoder driving circuit 3. The X decoder driving circuit 2 is driven by an X decoder drive timing signal $\phi_X$ while the Y decoder driving circuit 3 is driven by a Y decoder drive timing signal $\phi_Y$ delayed in phase with respect to the timing signal $\phi_X$. X and Y decoders (not shown) are driven in a time division fashion by the outputs of the driving circuits.

The address signal setting circuit (address buffer circuit) 1 is provided with a dynamic flip-flop circuit including FETs $Q_1 - Q_8$ to decrease power consumption. A power source voltage $V_{DD}$ (12 V) is applied to the drains of the load FETs $Q_1$ and $Q_2$ whose gates are applied with a load FET driving signal $\phi_0$ (14 V) which has a voltage level high enough to deliver an output level equal to the power source voltage at any one of the output nodes $a_0$ and $\bar{a}_0$ of the address signal setting circuit 1 at the time of chip selection. For the drive FETs $Q_3$ and $Q_4$, the gate of one FET is connected with the drain of the other and their sources are commonly connected with a reference or ground potential through the control FET $Q_6$ which gate is controlled by an address buffer driving signal $\phi_2$.

To make this flip-flop circuit unbalanced, the ratio W/L of the channel width W to the channel length L of the FET $Q_3$ is made different from that of the FET $Q_4$ so that the mutual conductance $g_m$ of the FET $Q_4$ is greater than that of the FET $Q_3$.

The FET $Q_5$ whose gate is controlled by a flip-flop resetting signal $\phi_1$ is provided to reset the output nodes $a_0$ and $\bar{a}_0$ of the address setting circuit 1 to the same potential level when the capacitances $C_1$ and $C_2$ at the nodes $a_0$ and $\bar{a}_0$ are charged. Between the drain of the FET $Q_3$ and the reference or ground potential is connected a series circuit of the FETs $Q_7$ and $Q_8$. The gate of the address input FET $Q_7$ is applied with the address input signal $A_0$ and the gate of the control FET $Q_8$ is controlled by the address buffer driving signal $\phi_2$.

The X decoder driving circuit 2 comprises a parallel connection circuit of series-connected drive FETs $Q_{10}$ and $Q_{12}$ and series-connected drive FETs $Q_{11}$ and $Q_{13}$. The output $a_0$ of the address signal setting circuit 1 is applied to both the FETs $Q_{10}$ and $Q_{13}$ and the output $\bar{a}_0$ of the circuit 1 is applied to both the FETs $Q_{12}$ and $Q_{11}$. One end of the parallel connection circuit is connected with the power source voltage $V_{DD}$ through a control FET $Q_9$ whose gate is controlled by an X decoder drive timing signal $\phi_X$. The address signal setting circuit 1 is connected with the X decoder driving circuit 2 through transfer FETs $Q_{14}$ and $Q_{14}'$ which receive the timing signal $\phi_X$. The output $a_{0X}$ is derived from the junction point of the series-connected FETs $Q_{10}$ and $Q_{12}$ while the output $\bar{a}_{0X}$ is obtained from the junction point of the series-connected FETs $Q_{11}$ and $Q_{13}$. FETs $Q_{15}$, $Q_{16}$, $Q_{25}$ and $Q_{25}'$ whose gates are controlled by a row (or X) address strobe signal $\overline{RAS}$ are provided to prevent the outputs from floating.

The Y decoder driving circuit 3 has an arrangement similar to the X decoder driving circuit 2. Namely, there is provided a parallel connection circuit of series-connected drive FETs $Q_{18}$ and $Q_{20}$ and series-connected drive FETs $Q_{19}$ and $Q_{21}$. The output $a_0$ of the address signal setting circuit 1 is applied to the gates of the drive FETs $Q_{18}$ and $Q_{21}$ through a transfer FET $Q_{22}$ which receives a Y decoder driving timing signal $\phi_Y$. On the other hand, the output $\bar{a}_0$ is applied to the gates of the drive FETs $Q_{20}$ and $Q_{19}$ through a transfer FET $Q_{22}'$ which also receives the Y decoder driving timing signal $\phi_Y$. One end of the parallel connection circuit is connected with the power source voltage $V_{DD}$ through a control FET $Q_{17}$ whose gate is controlled by the timing signal $\phi_Y$. The outputs $\bar{a}_{0Y}$ and $a_{0Y}$ are derived respectively from the junction point of the series-connected FETs $Q_{19}$ and $Q_{21}$ and the junction point of the series-connected FETs $Q_{18}$ and $Q_{20}$. FETs $Q_{23}$, $Q_{24}$, $Q_{26}$ and $Q_{26}'$ whose gates are controlled by a column (or Y) address strobe signal $\overline{CAS}$ are provided to prevent the outputs from floating.

All the FETs mentioned above are of n-channel enhancement type.

Figure 2:
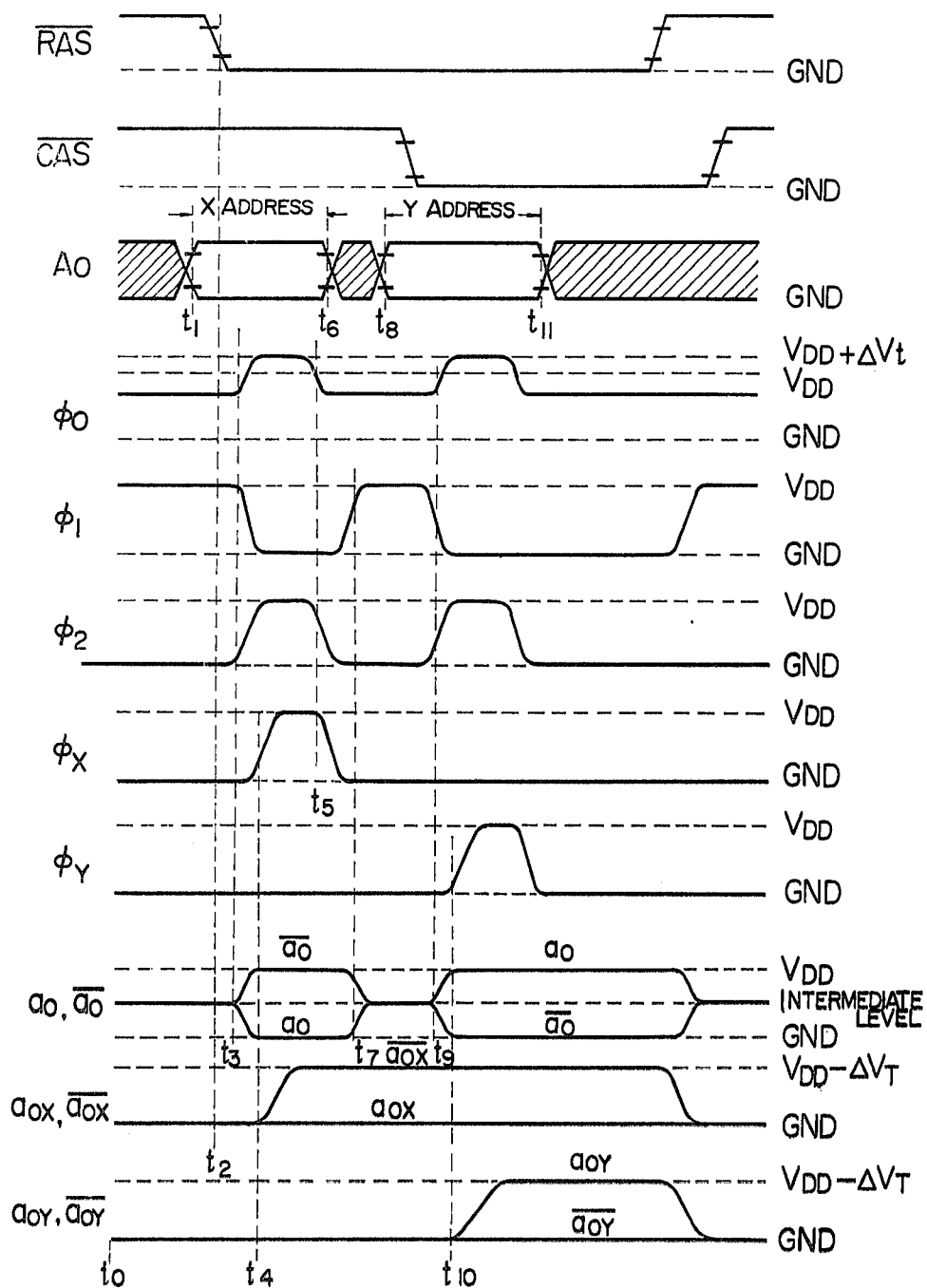
FIG. 2 illustrates signal waveforms useful in explaining the operation of the circuitry shown in FIG. 1.

Next, explanation will be made of the operation for address selection in the circuit arrangement shown in FIG. 1, with the aid of FIG. 2 showing signal waveforms useful in explaining the operation of the circuitry in FIG. 1.

Referring to FIG. 2, the signal $\phi_0$ for driving the load FETs $Q_1$ and $Q_2$ of the address signal setting circuit 1 has a first voltage level (8 V) during a period from time $t_0$ to time $t_2$ so that the load FETs $Q_1$ and $Q_2$ are conducting. Accordingly, the capacitances $C_1$ and $C_2$ associated with the output nodes $a_0$ and $\bar{a}_0$ are charged up to half (6 V) the power source voltage $V_{DD}$ (12 V) through the load FETs $Q_1$ and $Q_2$. On the other hand, the flip-flop resetting signal $\phi_1$ has a high level during the period from $t_0$ to $t_2$ so that the FET $Q_5$ is conducting. As a result, the capacitances $C_1$ and $C_2$ are exactly reset to the same level (6 V).

When the flip-flop resetting signal $\phi_1$ takes the reference potential level (GND) past time $t_3$, the FET $Q_5$ is turned off. Meanwhile, the load FET driving signal $\phi_0$ rises from the first voltage level to a higher level above $V_{DD} + \Delta V_t (\Delta V_t = V_{th} + \Delta V_{th})$ and therefore the voltage levels equal to the power source voltage level $V_{DD}$ applied to the drains of the load FETs $Q_1$ and $Q_2$ can be derived from the sources of the load FETs $Q_1$ and $Q_2$. At the same time, the address buffer driving signal $\phi_2$ takes the $V_{DD}$ level so that the FET $Q_6$ is turned on to release the charges stored in the capacitances $C_1$ and $C_2$. As a result, the address signal setting circuit 1 is set to one of two states in response to the state or value of the address input signal $A_0$.

When the address input signal $A_0$ is at a low or "0" level, the FET $Q_7$ to which the signal $A_0$ is applied is cut off so that the capacitance $C_2$ associated with the output node $\bar{a}_0$ discharges its stored charges as a current $I_2$ flowing through the drive FET $Q_3$ and the FET $Q_6$ while the charges stored in the capacitance $C_1$ associated with the output node $a_0$ are released as a current $I_3$ flowing through the drive FET $Q_4$ and the FET $Q_6$. Since the mutual conductance $g_m$ of the drive FET $Q_4$ is designed to be greater than that of the drive FET $Q_3$, as described above, the capacitance $C_1$ is earlier charged up than the capacitance $C_2$ so that the outputs $a_0$ and $\bar{a}_0$ are set respectively at the low ("0") and high ("1") levels.

On the other hand, when the address input signal $A_0$ is at a high or "1" level, the FET $Q_7$ is conductive. As a result, the charges stored in the capacitance $C_2$ associated with the output node $\bar{a}_0$ are released as a current $I_2$ through the FETs $Q_3$ and $Q_6$ and a current $I_1$ through the FETs $Q_7$ and $Q_8$. And if the mutual conductances of the FETs $Q_3$, $Q_4$, $Q_6$ and $Q_7$ are chosen to provide $I_1 + I_2 > I_3$, the capacitance $C_2$ discharges earlier than the capacitance $C_1$ so that the outputs $a_0$ and $\bar{a}_0$ are set respectively at the high ("1") and low ("0") levels.

Thus, the unbalanced dynamic flip-flop circuit including the drive FETs $Q_3$ and $Q_4$ having difference mutual conductances is used for an address signal setting circuit. Therefore, if the difference between the mutual conductances is made large enough, it is possible to prevent a small difference between $C_1$ and $C_2$ from causing an erroneous operation in which the address signal setting circuit 1 is set independent of the address input signal $A_0$.

As described above, when the input signal $A_0$ is at the low level, the address signal setting circuit 1 delivers the GND and $V_{DD}$ level signals at the output nodes $a_0$ and $\bar{a}_0$. Then, at time $t_4$, the X decoder driving timing signal $\phi_X$ takes the $V_{DD}$ level to cause the X decoder driving circuit 2 to operate. Accordingly, the output $a_{0X}$ of GND level and the output $\bar{a}_{0X}$ of about $V_{DD}$ level are generated in accordance with the GND level output $a_0$ and $V_{DD}$ level output $\bar{a}_0$ of the address signal setting circuit 1 so that the X decoder selects a predetermined X line.

Next, when the Y address strobe signal $\overline{CAS}$ takes the GND level after the completion of the X address selecting operation, the load FET driving signal $\phi_0$ accordingly resumes the high level (higher than $V_{DD} + \Delta V_t$) and the address buffer driving signal $\phi_2$ takes the $V_{DD}$ level. As a result, the flip-flop circuit is set so that if the address input signal $A_0$ is at, for example, the high level the outputs $a_0$ and $\bar{a}_0$ are respectively at the $V_{DD}$ and GND levels. In synchronism with the change in the column address strobe signal $\overline{CAS}$, the Y decoder drive timing signal $\phi_Y$ takes the $V_{DD}$ level so that the Y decoder drive circuit 3 is actuated to produce its outputs $a_{0Y}$ and $\bar{a}_{0Y}$ which are respectively at the high and GND levels. Consequently, the Y decoder is driven to select a predetermined Y line.

At the time of non-selection of chip when both the signals $\overline{RAS}$ and $\overline{CAS}$ are at the high level, the output-floating preventing FETs $Q_{15}$, $Q_{16}$, $Q_{23}$, $Q_{24}$, $Q_{25}$, $Q_{25}'$, $Q_{26}$ and $Q_{26}'$ are conductive to keep the outputs at the GND level so that an erroneous address selection due to noise will never be incurred.

As apparent from the explanation of operation, the FETs $Q_{10}$ and $Q_{12}$, FETs $Q_{11}$ and $Q_{13}$, FETs $Q_{18}$ and $Q_{20}$, and FETs $Q_{19}$ and $Q_{21}$ in the X and Y decoder driving circuits 2 and 3 shown in FIG. 1 form push-pull buffers respectively. Therefore, each of the X and Y decoder driving circuits 2 and 3 has a large so-called drivability for driving decoders.

Figure 3:
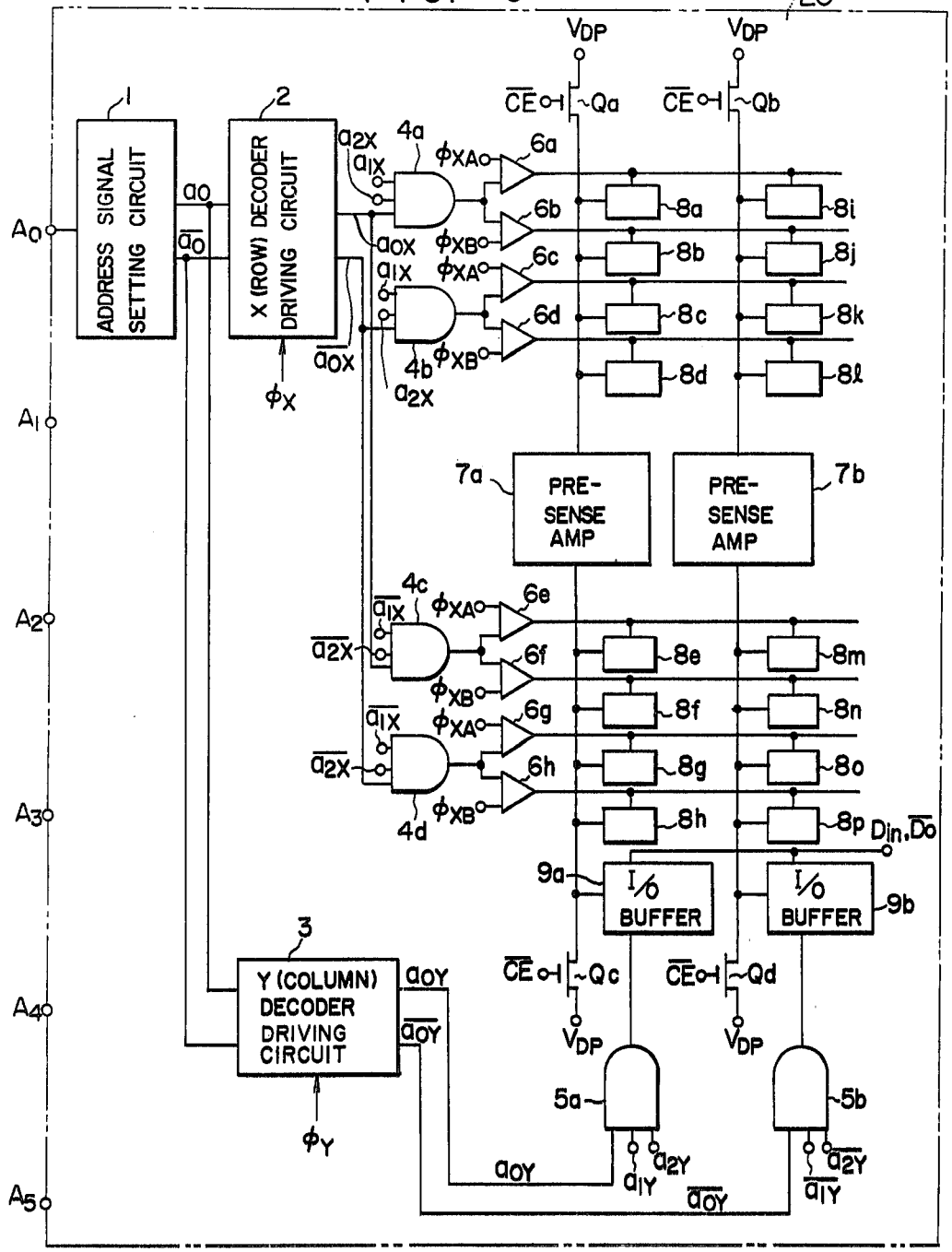
FIG. 3 schematically illustrates an example in which the address selecting circuitry shown in FIG. 1 is applied to a 4KRAM.

FIG. 3 shows an example in which the above-described address selecting circuitry according to this invention is applied to a 4KRAM.

In the figure, the address selecting circuitry according to this invention comprises the address signal setting circuit (or address buffer circuit) 1 to which the address input signal $A_0$ is applied, and X (row) and Y (column) decoder driving circuits 2 and 3 to which the outputs $a_0$ and $\bar{a}_0$ of the address signal setting circuit 1 are applied in common. The arrangement and interconnections of X (row) decoders 4a – 4d, gate circuits 6a – 6h, memory cells 8a – 8p, pre-sense amplifiers 7a and 7b, Y (column)

decoders 5a and 5b, and input/output circuits 9a and 9b are quite the same as those shown in FIG. 4 and therefore the description thereof will be omitted to avoid duplication.

A feature of the example shown in FIG. 3 is that a semiconductor chip 20 includes, between each of the address input pins $A_0 - A_5$ and the X and Y decoders, one address signal setting circuit and X and Y decoder driving circuits to which the output of the address signal setting circuit is commonly supplied.

As apparent from the above description of the embodiment of this invention, in the case where this invention is applied to a 4KRAM, the 4KRAM can be implemented by providing only six address signal setting circuits or buffer circuits for six address input signals $A_0 - A_5$.

According to this invention, therefore, the number of the address buffer circuits can be smaller in comparison with the conventional semiconductor memory device so that the power consumption can be considerably reduced. This invention uses six address buffer circuits while the system shown in FIG. 4 employs twelve address buffer circuits and therefore the power consumed by the buffer circuits in this invention is about half the power consumed by the buffer circuits in the circuitry shown in FIG. 4. Moreover, the reduction in the number of the used buffer circuits facilitates the improvement in integration density and the accompanied decrease in the number of address input pins and the number of peripheral circuits assures a stable operation and a high liability. Further, according to this invention, the output-floating preventing FETs are provided so that the erroneous address selection can be prevented and a large noise margin can be obtained.

The timing pulse signals $\phi_X$ and $\phi_Y$ for driving the X and Y decoders in a time division fashion can be produced as well-known by passing the row and column address strobe signals $\overline{RAS}$ and $\overline{CAS}$ through suitable delay stages respectively (see, for example, FIGS. 3, 4, 5 and 6 of U.S. Pat. No. 3,969,706). The row address strobe signal $\overline{RAS}$ is the same as an ordinary chip enable signal (CE) while the column address strobe signal $\overline{CAS}$ can be formed by a signal obtained through the delay of the $\overline{RAS}$ signal and the Y line selection signal supplied externally. Therefore, this invention needs no novel circuit other than conventional ones and the timing mechanism is also simple, so that the design is easy and the merit is very great.

This invention is by no means limited to the embodiment described above, but may include numerous variations.

The concrete configuration of the address signal setting circuit (address buffer circuit) 1 may be of any type which performs the desired function. The same is true for the X and Y decoder driving circuits.

For example, to make the flip-flop circuit of the address signal setting circuit unbalanced, either the capacitances $C_1$ and $C_2$ associated with the output nodes or the mutual conductances $g_m$ of the load FETs $Q_1$ and $Q_2$ may be made different from each other.

In the case where the capacitances $C_1$ and $C_2$ are such that $C_1 < C_2$, the mutual conductances $g_m$ of the load FETs $Q_1$ and $Q_2$ are set equal to each other and the mutual conductances of the drive FETs $Q_3$ and $Q_4$ are also set equal to each other. At the time of non-selection of chip, if the output nodes $a_0$ and $\bar{a}_0$ are at the same potential, the charges stored in the capacitance $C_2$ associated with the output node $\bar{a}_0$ is more than the charges stored in the capacitance $C_1$ associated with the output node $a_0$. Therefore, if the address input signal $A_0$ is at the low level at the time of non-selection of chip, the capacitance $C_1$ empties earlier than the capacitance $C_1$. Then, the outputs $a_0$ and $\bar{a}_0$ are set to the GND and $V_{DD}$ levels respectively. When the address input signal $A_0$ is at the high level, the FET $Q_7$ is turned on. In that case, since the path of the current $I_1$ is provided, the outputs $a_0$ and $\bar{a}_0$ are set to the $V_{DD}$ and GND levels respectively.

On the other hand, in the case where the mutual conductance of the load FET $Q_1$ is made greater than that of the load FET $Q_2$, the output capacitances $C_1$ and $C_2$ and the mutual conductances of the drive FETs $Q_3$ and $Q_4$ are set equal to each other. After the outputs $a_0$ and $\bar{a}_0$ have taken the same potential through the conduction of the FET $Q_5$ at the time of non-selection of chip, the charges stored in the capacitances associated with the output nodes are discharged as the currents $I_2$ and $I_3$ at the time of selection of chip. When the address input signal $A_0$ is at the low level, the capacitances $C_1$ and $C_2$ are recharged through the load FETs $Q_1$ and $Q_2$. In this case, the capacitance $C_2$ is earlier charged up than the capacitance $C_1$ since the mutual conductance of the $Q_1$ is greater than that of the $Q_2$ so that the outputs $\bar{a}_0$ and $a_0$ are set to the $V_{DD}$ and GND levels respectively. When the address input signal $A_0$ is at the high level, the FET $Q_7$ is turned on. Accordingly, the capacitance $C_2$ discharges earlier due to the currents $I_1$ and $I_2$ than the capacitance $C_1$ so that the outputs $a_0$ and $\bar{a}_0$ are set to the GND and $V_{DD}$ levels respectively.

Though the X and Y decoder circuits driven by the output of the address selecting circuitry have been shown and described with respect to the specified ones, they way take any other configuration which has the desired function. For example, they may be replaced by the well-known arrangement shown in FIG. 10 of U.S. Pat. No. 3,969,706.

Moreover, though in the above-described particular example this invention has been applied to a 4KRAM, it should be noted that this invention may be applied to any RAM such as 1KRAM or 16KRAM.

Further, in the above embodiment, all the FETs are referred to as n-channel enhancement type, but the same effect can be obtained by using p-channel enhancement type FETs in place of the n-channel ones. In such a case, it is only necessary to invert the polarity of the used power source.

The present invention is widely applicable to address selecting circuitries for semiconductor memory devices which necessity two difficult logic output signals for every address input signal.

I claim:

1. In a semiconductor memory device including a matrix of memory cells arrayed in rows and columns, an address selecting circuitry for driving row and column decoder circuits connected with said rows and columns respectively, comprising:

an address signal setting circuit for receiving an address input signal to produce at their output nodes two selected different address setting signals in accordance with said address input signal;

a row decoder driving circuit having two input nodes thereof coupled with the two output nodes of said address signal setting circuit respectively and two output nodes thereof coupled with said row decoder circuit, said row decoder driving circuit being responsive to a row decoder drive timing signal to produce at the two output nodes thereof two different row decoder driving signals corresponding to said two address setting signals respectively; and a column decoder driving circuit having two input nodes thereof coupled with the two output nodes of said address signal setting circuit respectively and two output nodes thereof coupled with said column decoder circuit, said column decoder driving circuit being responsive to a column decoder drive timing signal to produce at the two output nodes thereof two different column decoder driving signals corresponding to said two address setting signals respectively.

2. An address selecting circuitry according to claim 1, wherein said row and column decoder drive timing signals are shifted in phase from each other so that said row and column decoder circuits are driven in a time division fashion.

3. An address selecting circuitry according to claim 1, wherein said address signal setting circuit includes (a) a flip-flop circuit means having first and second drive FETs and first and second load FETs, the gate and drain of said first drive FET being connected with the drain and gate of said second drive FET respectively, the sources of said first and second drive FETs being commonly connected, said first and second load FETs being connected between the drain of said first drive FET and a first reference potential and between the drain of said second drive FET and said first reference potential respectively, the drains of said first and second drive FETs providing the two output nodes of said address signal setting circuit respectively, the gates of said first and second load FETs being controlled by a first clock signal, (b) a first control FET connected between the sources of said first and second drive FETs and a second reference potential and having its gate controlled by a second clock signal, (c) a means responsive to a third clock signal to reset the two output nodes of said address signal setting circuit to the same potential level, and (d) an address input FET and a second control FET series-connected between the drain of said first drive FET and said second reference potential, the gate of said address input FET being applied with said address input signal, the gate of said second control FET being controlled by said second clock signal.

4. An address selecting circuitry according to claim 3, wherein the mutual conductances of said first and second drive FETs in said address signal setting circuit are different from each other.

5. An address selecting circuitry according to claim 3, wherein the mutual conductances of said first and second load FETs in said address signal setting circuit are different from each other.

6. An address selecting circuitry according to claim 3, wherein said address signal setting circuit further includes first and second capacitances which are coupled with the two output nodes thereof respectively and whose values are different from each other.

7. An address selecting circuitry according to claim 3, wherein each of said row and column decoder driving circuits includes (a) a parallel connection circuit of series-connected third and fourth drive FETs and series-connected fifth and sixth drive FETs, the gates of said third and sixth drive FETs being commonly connected, the gates of said fourth and fifth drive FETs being commonly connected, one end of said prallel connection circuit being connected with said second reference potential, (b) a third control FET connected between the other end of said parallel connection circuit and said first reference potential, and (c) first and second transfer FETs connected between the two output nodes of said address signal setting circuit and the gates of said third and fourth drive FETs respectively, the gates of said third control FET and said first and second transfer FETs in said row decoder driving circuit being controlled by said row decoder drive timing signal, the junction point of said third and fourth FETs and the junction point of said fifth and sixth drive FETs in said row decoder driving circuit providing the two output nodes of said row decoder driving circuit respectively, the gates of said third control FET and said first and second transfer FETs in said column decoder driving circuit being controlled by said column decoder drive timing signal, the junction point of said third and fourth FETs and the junction point of said fifth and sixth drive FETs in said column decoder driving circuit providing the two output nodes of said column decoder driving circuit respectively.

8. An address selecting circuitry according to claim 7, wherein output-floating preventing FETs having their gates controlled by a row address strobe signal are connected with the two output nodes, the gate of said third drive FET and the gate of said fourth drive FET in said row decoder driving circuit respectively, and output-floating preventing FETs having their gates controlled by a column strobe signal are connected with the two output nodes, the gate of said third drive FET and the gate of said fourth drive FET in said column decoder driving circuit respectively.

9. In an address selecting system for a semi-conductor memory device comprising a semiconductor chip including a predetermined number of address input pins supplied with row and column address data and row and column decoder circuits, the improvement in that said semiconductor chip includes, between each address input pin and said row and column decoder circuits, an address signal setting circuit for receiving an address input signal from that address input pin to produce a set of two different logic signals, and row and column decoder driving circuits to which said set of two different logic signals is commonly supplied.

* * * * *